United States Patent [19]
Gilbert

[11] Patent Number: 5,959,815
[45] Date of Patent: Sep. 28, 1999

[54] METHOD AND APPARATUS FOR DETECTING POTENTIALLY DAMAGING ELECTRICAL FIELDS

[75] Inventor: Timothy G. Gilbert, Vermillion, S. Dak.

[73] Assignee: Gateway 2000, Inc., North Sioux City, S. Dak.

[21] Appl. No.: 09/042,779

[22] Filed: Mar. 17, 1998

[51] Int. Cl.⁶ ................................................. H02H 3/22
[52] U.S. Cl. .................................. 361/1; 361/119; 324/72
[58] Field of Search .................................... 361/111, 117, 361/118, 119, 1; 324/72; 342/198

[56] References Cited

U.S. PATENT DOCUMENTS

| | | | |
|---|---|---|---|
| 3,772,594 | 11/1973 | Kuehnast | 324/72 |
| 3,891,919 | 6/1975 | Penninger | 324/72 |
| 4,095,262 | 6/1978 | St. Clair | 361/1 |
| 4,276,576 | 6/1981 | Uman et al. | 361/1 |
| 4,422,037 | 12/1983 | Coleman | 324/72 |
| 4,672,305 | 6/1987 | Coleman | 324/72 |
| 4,806,851 | 2/1989 | Krider et al. | 324/72 |
| 4,823,228 | 4/1989 | Bittner | 361/218 |
| 5,083,042 | 1/1992 | Merchant | 307/149 |
| 5,291,208 | 3/1994 | Young | 342/198 |
| 5,448,161 | 9/1995 | Byerley, III et al. | 324/72 |
| 5,453,899 | 9/1995 | Page | 361/1 |
| 5,521,603 | 5/1996 | Young | 342/198 |

*Primary Examiner*—Michael J. Sherry
*Attorney, Agent, or Firm*—Schwegman, Lundberg, Woessner & Kluth P.A. & Anothy Clairborne

[57] ABSTRACT

A lightning detection system implemented via a modem or a soundcard is described. The modem is either internally or externally coupled to a communication or computer device. The modem uses one of the unused wires present in the four wire telephone cord that plugs into the modem as an antenna. A digital signal processor (DSP) internal to the modem is configured to function as an AM detector wherein the received signals are processed for determination of a potentially damaging lightning storm. The modem generates an interrupt request based upon the results of the DSP. The interrupt request notifies the communication or computer device which in turn is programmed via a software application to notify the user, such as displaying a warning message on a display device or in initiating a power down sequence.

40 Claims, 6 Drawing Sheets

METHOD AND APPARATUS FOR DETECTING POTENTIALLY DAMAGING ELECTRICAL FIELDS

TECHNICAL FIELD OF THE INVENTION

The present invention relates generally to electrical devices and in particular to a method and apparatus for detecting potentially damaging electrical fields.

BACKGROUND OF THE INVENTION

Electrical and electronic devices should be protected from high voltage levels. Electrical disturbances in the atmosphere have long posed perilous problems to electrical devices. When lightning strikes an electrical power line, high voltage levels or spikes are sent over the line directly to communication or computer devices serviced by that line. This problem, nowadays, has become particularly troublesome since many of these systems are left powered on to receive faxes, e-mail, etc. When operational during a thunderstorm, the likelihood of damage from a lightning strike is greater than if these devices were completely powered down.

Most severe weather storms are accompanied by the occurrence of lightning flashes which result in a naturally occurring wide-band radio frequency transmission. The resulting transmission ordinarily interferes with reception of signals from radio broadcast transmission, and can advantageously be utilized to detect the occurrence of the lightning flashes within the range of a radio receiver to indicate the approach of severe weather long before there is any other indication. In most cases, lightning induced interference can be heard on ordinary radio receivers three to four hours before the accompanying storm arrives in the area of the receiver, and long before the storm is visible.

The conventional approach for protecting electrical devices from damaging voltage levels involves utilization of passive devices. These passive devices cause power to be removed from the protected devices via disconnecting the attached electrical power line interface after high voltage levels or spikes are actually detected, i.e., after a storm has already reached a magnitude that can damage or even destroy the electrical devices. Therefore, lacking in the prior art is a protection system that protects electrical equipment before a storm reaches a perilous magnitude.

In addition to passive protection devices, expensive complex devices, such as radar, have been used to detect the approach of a storm. As a less costly alternative, an ordinary amplitude modulated (AM) radio receiver tuned to receive selected radio frequency signals generated by lightning flashes may be utilized to detect an approaching storm. However, once the AM radio receiver detects the signals characteristic of a storm, additional means must be undertaken to notify the user. This extra effort is not optimally efficient because notifying the user adds to the expense of providing a lightning detection system so that protective measures may be undertaken. Therefore, also lacking in the prior art is a satisfactory and economical means for detecting and providing notification of the approach of a storm.

There is a need for a lightning detection system for the protection of electrical devices wherein the detection system notifies a user before the lightning storm reaches a perilous magnitude. Specifically, there is a need for such a system that is economical and does not result in redundant parts and circuitry when interfaced with communication and computer devices.

SUMMARY OF THE INVENTION

A digital signal processor (DSP) in a computer system is used to detect lightning in an approaching storm and generates signals to inform the computer system of the storm. In particular, the DSP is part of a modem and detects lightning strikes in an area using one of the unused wires in the telephone line as a receiving antenna. As another configuration for a lightning detection system, the DSP is part of a soundcard and uses one of the speaker wires as a receiving antenna. Once a threatening storm is detected, an interrupt request is generated by the modem or the soundcard and is directed to the host system coupled to the modem or soundcard. The host system is configured to initiate a preprogrammed function, such as displaying a warning message to the user or automatically powering down the system to minimize damage from a lighting strike.

In another illustrative embodiment, a lightning detection system is described which comprises a modem or a soundcard having a digital signal processor configured to detect and measure electromagnetic pulses for indicating the incipient presence of a potentially damaging electrical field level, and a means for generating an interrupt signal responsive to a predetermined signal strength level of the electromagnetic pulses.

In yet another illustrative embodiment, a method of indicating the incipient presence of a potentially damaging electrical field level is described, comprising the steps of receiving electro-magnetic pulses in a modem, wherein one of the unused wires in a telephone line coupled to the modem functions as an antenna, measuring an electric field level of the electro-magnetic pulses, and generating an interrupt signal responsive to a predetermined signal strength level of the measured electric field, wherein the electrical device receives the interrupt signal, and initiating a preprogrammed function responsive to the interrupt signal.

In a still further embodiment, a lightning detection system is integrated into a computer system, wherein a modem having a digital signal processor is configured to detect and measure electro-magnetic pulses for indicating the incipient presence of a potentially damaging electrical field level, wherein the modem generates an interrupt signal responsive to a predetermined signal strength level of the electro-magnetic pulses, a processor, wherein the processor receives the interrupt signal, a computer-readable medium, and at least one application program, each application program executed by the processor from the computer-readable medium in response to the interrupt signal, wherein each program initiates one or more preprogrammed functions.

The lightning detection apparatus provides an efficient and economic means for protecting electrical devices from potentially damaging lightning strikes. The signal processing utilized for detecting and measuring the electromagnetic pulses discharged during a lightning strike is inherent in DSPs, which allows the DSP in either a modem or soundcard to provide this function in an economical and efficient manner. Instead of waiting for the storm to actually discharge voltage spikes onto an electrical power line, the lightning protection device is proactive in that it anticipates arrival of the storm using the processing results of the DSP. Once a threatening storm is detected, the user has time to take necessary precautions. Furthermore, the electrical device coupled to the modem or soundcard can be setup to undertake specific tasks without interaction of the user.

Therefore, detecting lightning via a modem or soundcard permits the user to take precautions in order to protect communication and computer devices from high voltage levels or spikes that may be introduced onto the electrical power line. In different embodiments of the invention, signal processing, analog and digital filters, electronic equipment, and interfaces of varying scope are described. Still other and

DETAILED DESCRIPTION OF THE PREFERRED EMBODIMENT

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present inventions. The following detailed description is, therefore, not to be taken in a limiting sense.

Figure 1:
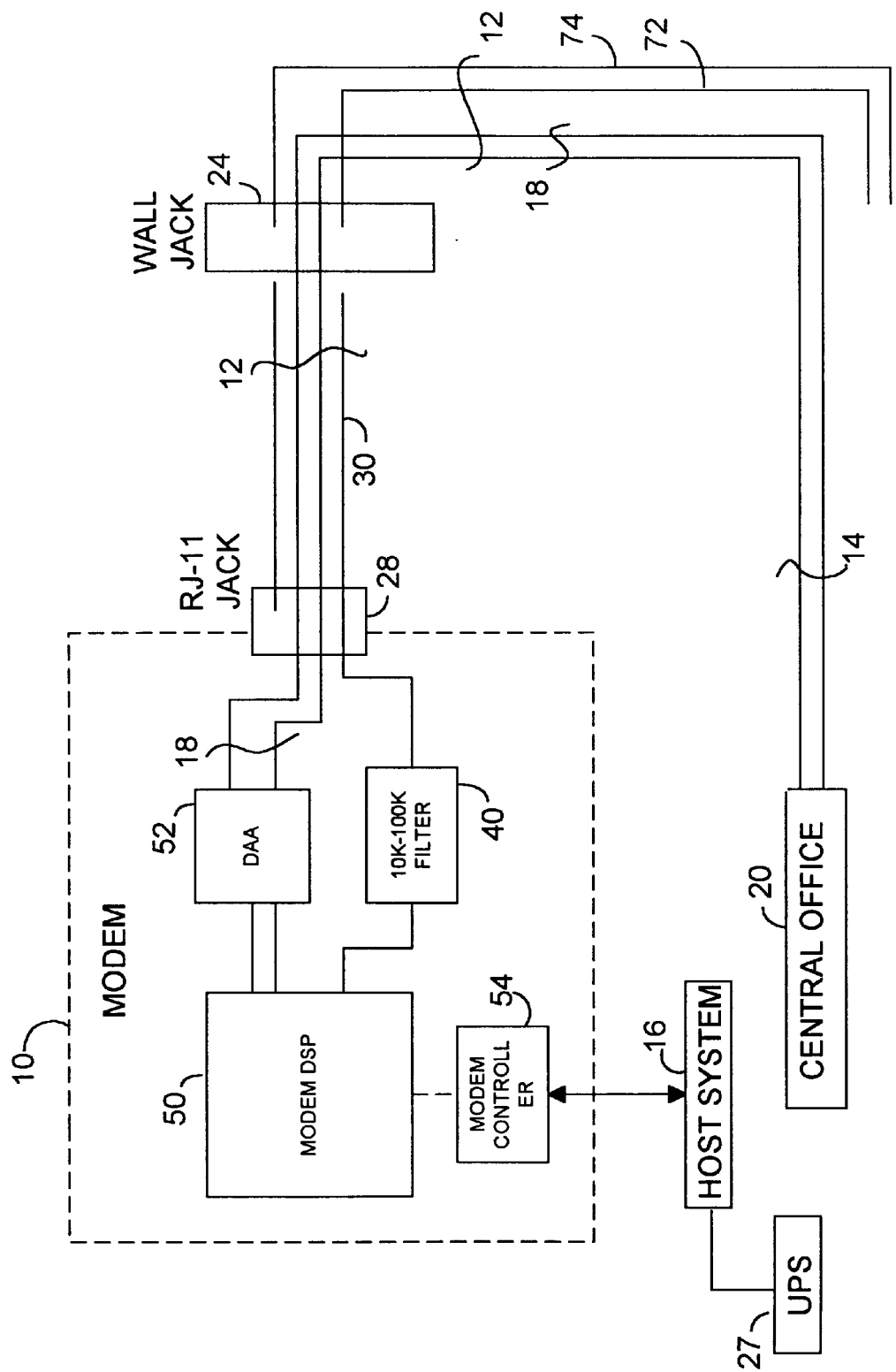
FIG. 1 is block diagram of an embodiment of a modem having a lightning detection system according to the teachings of the present invention.

FIG. 1 is block diagram of an embodiment of modem 10 having a lightning detection system. Modem 10 is either internally or externally coupled to host system 16, which is typically a communication or computer device.

Modem design and modem performance parameters as well as their functions are well known to one skilled in the art. Modem 10 transfers digital data over a telephone lines 12. A common standard used in modems is V.32bis which is an international high speed standard. The V.32bis extends the V.32 standard to 14,400 bits per second while allowing fallback to intermediary speeds of 7,200 and 12,000 bits per second in addition to the 4,800 and 9,600 bits per second speeds of the V.32 standard. Modulation schemes under the V.32bis standard are quadrature amplitude modulation (QAM) and trellis modulation. Modem 10 is not limited to the V.32bis standard and other modem standards are acceptable.

In addition to modulating and demodulating digital data, other capabilities of modem 10 may include voicemail, answering machine and speaker phone functions. To perform the desired analog and digital processing required for the exchange of voice and data over telephone lines 12, a digital signal processor (DSP) is utilized. DSPs perform a wide variety of signal processing functions and their implementation into electronic devices are well known in the art.

A physical connection is thus made between a central office 20 and each end user. The end user may be located in a home or office building. Independent of the location, wall jack 24 is placed at the receiving end where modem 10 is located. Dedicated wires 12 are routed from the central office 20 to wall jack 24. Wires 12 actually comprise four wires but only two of the wires are actually used. Wire pair 18 are only needed for the "tip" and "ring" functions required by central office 20 for establishing a connection with the end user that supports voice and data exchanges. The other two wires, referred to as separate wires 72 and 74, are used for additional services and functions.

Telephone line 12 provides the connection between wall jack 24 and modem 10. Modem 10 is connected to telephone lines 12 via RJ-11 jack 28, wherein modem 10 is coupled to host system 16, wherein host system 16 is a communication or computer device. Wire pair 18 continues through jack 28 and is connected to data access arrangement (DAA) 52. Voice and data communication signals routed over telephone line 12 via central office 20 are received by DAA 52. DAA 52 provides isolation between the DSP 50 and the central office 20. Such devices are available as "off the shelf" modules and are well known in the art. Signals received by DAA 52 are then directed to DSP 50.

DSP 50 is configured to do signal processing, including both digital and analog functions. Processing functions include, for example, recognition of dial tones, recognition of fax modem signatures, and recognition of handshake signals. Once DSP 50 recognizes a particular type of signal, preprogrammed signal processing functions are performed by DSP 50.

Because the electro-magnetic pulses given off by lightning is strictly an analog function, DSP 50 is utilized to detect and process the signals associated with lightning. First, to direct these analog signals to DSP 50, an antenna is required. Single wire 30, which is one of the two unused wires in telephone line 12, is connected to filter 40 via jack 28. Single wire 30 functions as an antenna to receive the naturally occurring wide-band radio frequency transmissions characteristic to lighting.

The resulting transmission from a lightning flash ordinarily interferes with the reception of signals from radio broadcast transmissions, and can thus advantageously be utilized to detect the occurrence of the lightning within the range of a radio receiver. The range of the radio receiver is beyond the visual indications of an approaching lightning storm, which serves to provide a sufficient time of response for the user to react when notified of the approaching storm.

Early detection of a storm thus provides the opportunity to notify the user on the approach of severe weather long before there is any other indication of the approach of the storm. Propagation characteristics of AM signals allow wire 30 to operate as an antenna for the reception of such signals.

Filter 40 receives the signals detected by antenna wire 30, wherein filter 40 operates to pass signals within the 10 kHz to 100 kHz frequency range. This frequency range is characteristic of the electro-magnetic pulses generated by lightning flashes. Received signals are applied to DSP 50 for further filtering and processing.

Processing of the signals applied to DSP 50 received via wire 30 are well known to one skilled in the art. One method of processing the detected signals is to measure its signal strength and compare this value to a normalized reading previously taken. This mark serves as a reference to determine if the storm is growing worse or moving away. A method for detecting lighting is discussed in more detail when reference is made to FIG. 4.

Regardless of the implemented method, modem 10 generates an interrupt request once DSP 50 determines that a potentially damaging lightning storm is approaching the area. DSP 50 communicates with modem controller 54, which generates an interrupt request that is applied to host system 16. The interrupt request received by host system 16 is not limited to an interrupt request. Any type of signal provided by modem 10 that notifies host system 16 that lightning has been detected is acceptable.

The interrupt request notifies host system 16 which in turn may be programmed via a software application to notify the user, such as displaying a warning message on a display device. In addition, the interrupt request may also initiate other software applications to perform any variety of tasks, such as operating a mechanical device that physically unplugs or disconnects modem 10 from the telephone plug 24 and switch the host system 16 to an uninterruptable power supply 27. Another software application turns on a camera for taking pictures of the lightning. The interrupt request could likewise prompt host system 16 to send a message to a different host system 16 indicating that it is shutting down and disconnecting itself from the network. The above examples are not to be taken in a limiting sense and only serve as examples of what can be done with an interrupt request generated by modem 10 after lightning has been detected.

Figure 2:
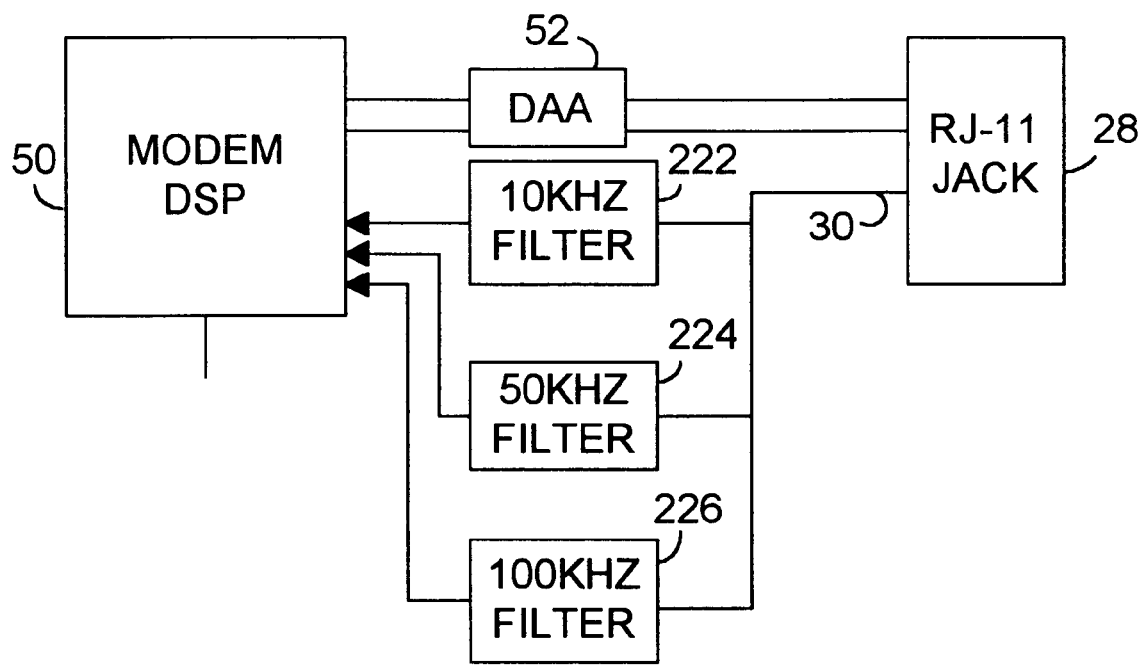
FIG. 2 is block diagram of an alternative embodiment of a modem having a lightning detection system according to the teachings of the present invention.

FIG. 2 is block diagram of an alternative embodiment of modem 10 having a lightning detection system according to the teachings of the present invention. Separate filters 222, 224 and 226 are coupled to antenna wire 30, wherein each filter is tailored to a specific frequency range. This method reduces the workload of DSP 50 since the latter does not have to separate out and process desired specific frequencies used in the detection process of determining whether lightning is approaching. Furthermore, if DSP 50 workload is reduced, DSP 50 design is simpler to implement.

Figure 3A:
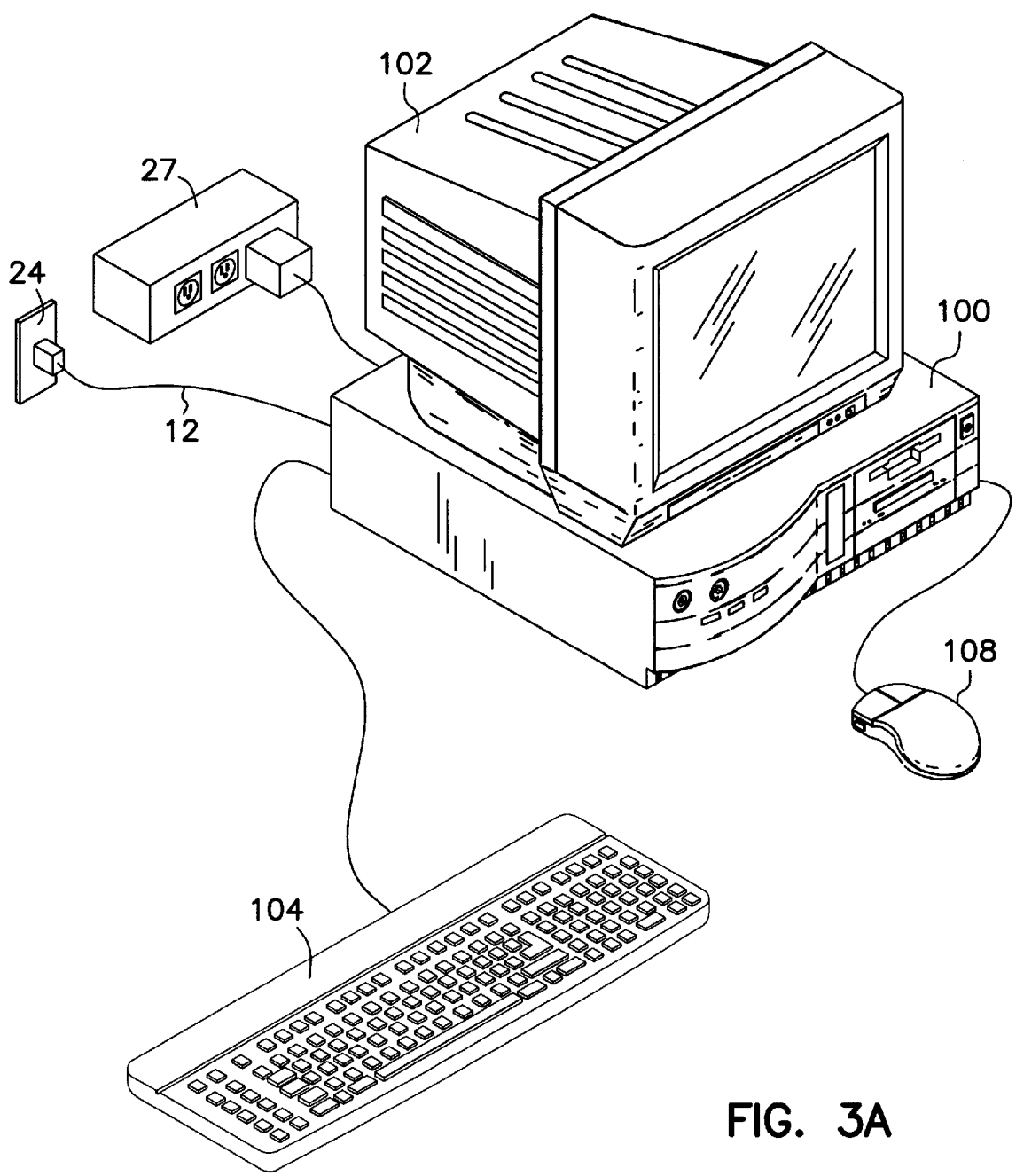
FIGS. 3A and 3B are isometric views of a typical computer system incorporating an implementation of the lightning detection system.
Figure 3B:
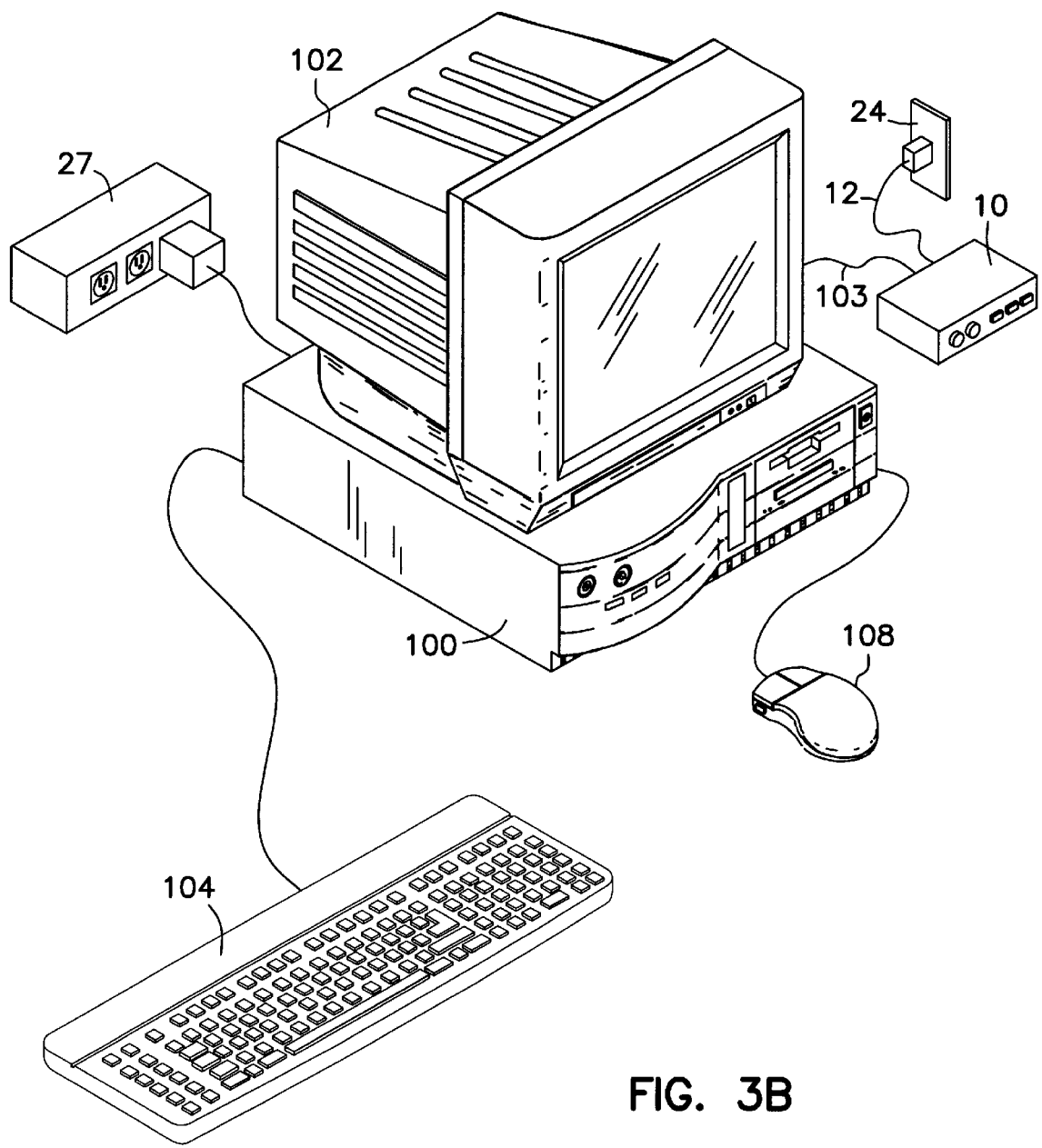

FIGS. 3A and 3B are isometric views of a typical computer system 100 in conjunction in which embodiments of modem 10 having a lightning detection system. In one embodiment, modem 10 is internal to computer system 100, as shown in FIG. 3A. In an alternative embodiment, modem 10 is external to computer system 100, as shown in FIG. 3B. In this configuration, modem 10 communicates with computer system 100 via serial interface 103. However, modem 10 is not limited to a serial interface and other types of interfaces are acceptable.

Computer system 100 is coupled to monitor 102, pointing device 108, and keyboard 104 and an uninterruptable power supply (UPS) 27. Computer system 100 further includes a microprocessor coupled to a computer readable medium such as, for example, random access memory (RAM), read only memory (ROM), and one or more storage devices, such as a hard disk drive, a floppy disk drive (into which a floppy disk can be inserted), an optical disk drive, or a digital tape cartridge drive. The lightning detection apparatus is not particularly limited to any type of computer system 100. The construction and operation of such computers are well known in the art.

Monitor 102 permits the display of information for viewing by a user of computer system 100. The invention is likewise not limited to any particular monitor 102. Monitors 102 include cathode ray tube (CRT) displays, as well as flat panel displays such as liquid crystal displays (LCDs). Pointing device 108 permits the control of a screen pointer provided by a graphical user interface of operating systems such as versions of Microsoft Windows. The invention is not limited to any particular pointing device 108. Such pointing devices include mouses, touch pads, trackballs and point sticks. In one embodiment, computer system 100 is a Gateway 2000, Inc., desktop personal computer, monitor 102 includes a super-VGA CRT display and pointing device 108 is a mouse. Finally, keyboard 104 entry of textual information into computer system 100, as known within the art, is not limited to any particular type of keyboard.

Figure 4:
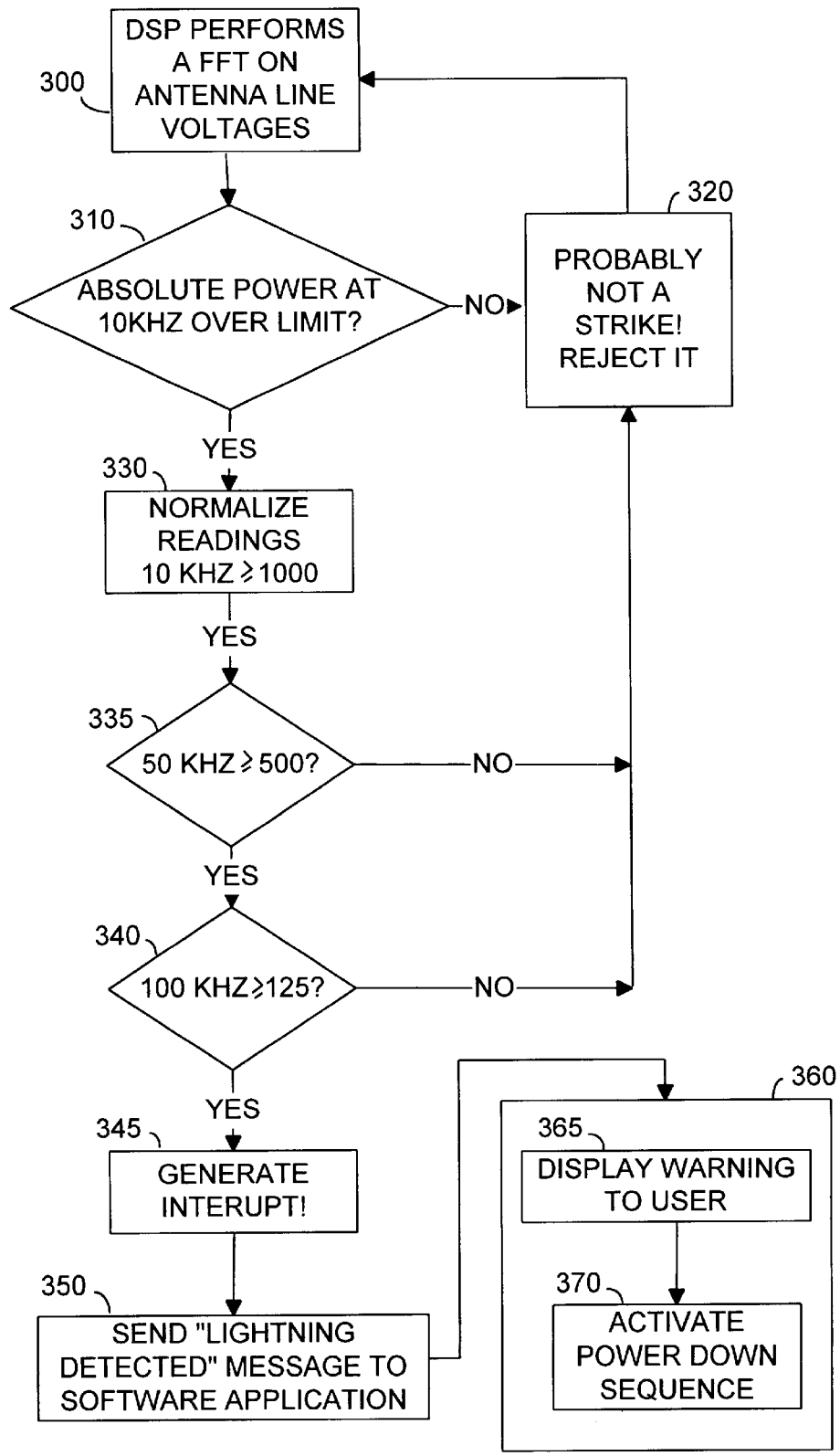
FIG. 4 is a flowchart showing a method of detecting lightning according to the teachings of the present invention.

FIG. 4 is a flowchart showing a method of detecting lightning according to the teachings of the present invention. A lightning strike is typically concentrated around 10 KHz before it begins to taper off. By measuring the power of received signals at 10 kHz, 50 KHz and 100 KHz, DSP 50 can reject false triggers.

In step 300, DSP 50 first performs a fast-Fourier transform (FFT) on the voltage levels of the signals received by antenna wire 30. In step 310, DSP 50 compares the absolute power of the signal at 10 KHz to a predetermined threshold. If the calculated value of the signal is less than the threshold, DSP 50 rejects that signal, assumes it was not a lightning strike and performs a FFT on another received signal. However, if the first received signal is above the threshold, then the signal is normalized to 1,000 mV/m in step 330. Distance to the storm is estimated by reference to absolute power at 10 KHz using empirical measurements.

After the 10 KHz signal is normalized, step 335 measures the power of the signal at 50 KHz. DSP 50 scales the normalized signal using a predetermined factor as needed at 10 KHz so that the power at 50 KHz will be approximately 500 mV/m. If the measured value of the signal at 50 KHz is less than 500 mV/m, then DSP 50 rejects that signal, assumes it was not a lightning strike and performs a FFT on another received signal.

However, if the received signal is greater than 500 mV/m, then step 340 measures the power of the signal at 100 KHz. DSP 50 assumes that the power at 100 KHz will be approximately 125 mV/m. If the measured value of the signal at 100 KHz is less than 125 mV/m, then DSP 50 rejects that signal, assumes it was not a lightning strike and performs a FFT on another received signal.

However, if the received signal is greater than 125 mV/m, then DSP 50 generates an interrupt request in step 345. Step 350 receives the interrupt request and sends a "lightning detected" message to a software application. The software application performs preprogrammed functions in step 360. As an example of two preprogrammed functions, step 365 displays a warning message to the user on a display device. In step 370, the preprogrammed function activates a power down sequence for host system 16.

Figure 5:
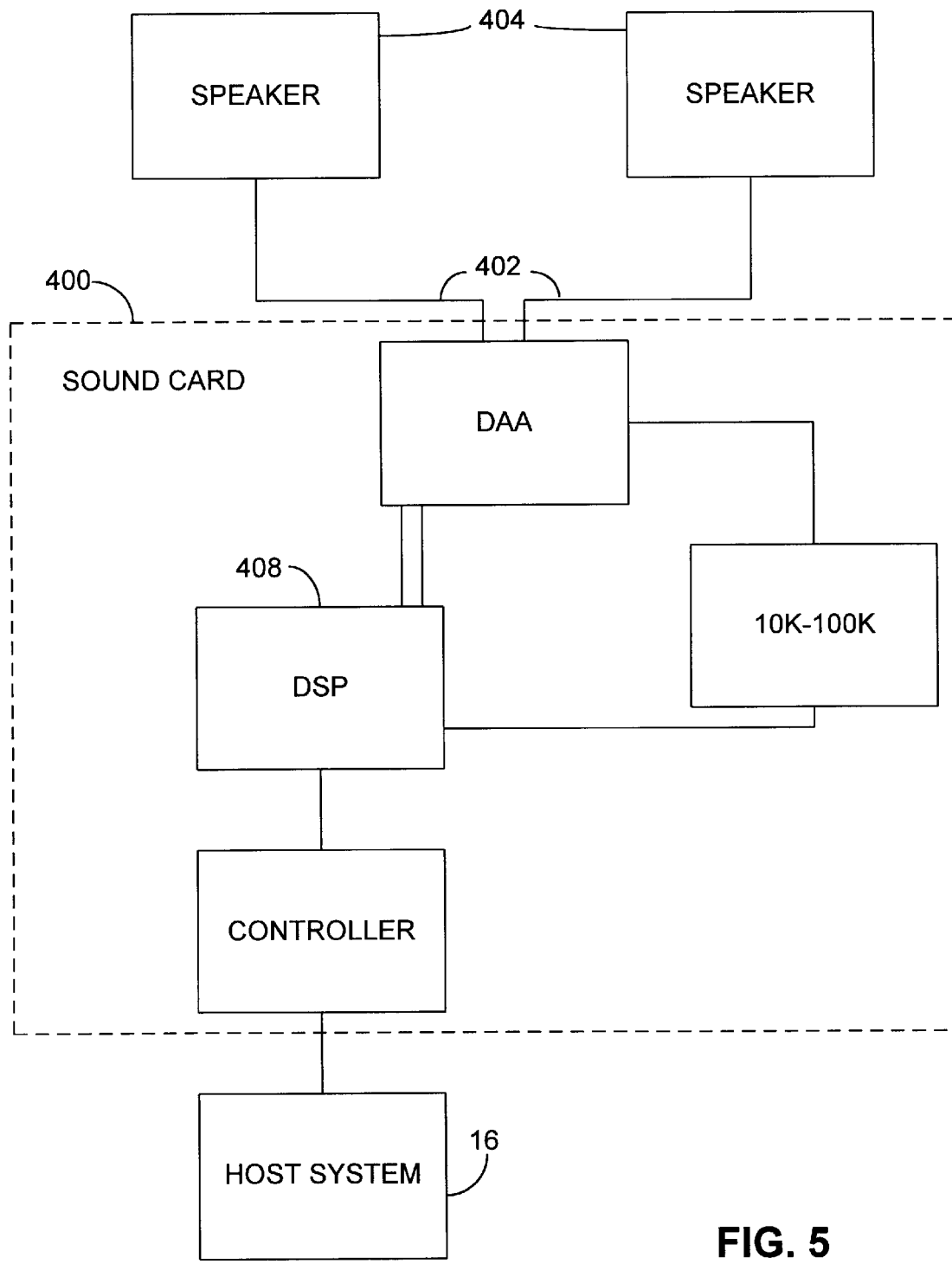
FIG. 5 is a block diagram of an alternative embodiment of a lightning detection system according to the teachings of the present invention.

FIG. 5 is a block diagram of an alternative embodiment of a lightning detection system according to the teachings of the present invention wherein similar, like or identical reference numerals utilized in FIG. 1 indicate like, similar or identical comments. The alternative embodiment utilizes soundcard 400. Soundcard 400 has all of the necessary components for detecting lightning and providing an interrupt signal; e.g., attached speaker wire 402 connected to speakers 404, wherein speaker wire 402 functions as a receive antenna for reception of the electro-magnetic signals, DSP 408 for signal processing, and soundcard 400 is coupled to host system 16, which receives the interrupt request. Soundcards are well known to one skilled in the art.

The lightning detection system implemented in the alternative embodiment on soundcard 400 utilizes the same approach previously discussed to determine the presence of lightning.

Although specific embodiments have been illustrated and described herein, it will be appreciated by those skilled in the art that any arrangement which is calculated to achieve the same purpose may be substituted for the specific embodiment of the present invention. For example, the DSP could be an application specific integrated circuit (ASIC) or even be a hardwired circuit performing the processing functions equivalent to the DSP. In a similar manner, the lightning detection system does not have to connect to the telephone line; any wire connected to the lightning detection system that functions as a receive antenna supports the present invention. This application is intended to cover any adaptations or variations of the present invention. Therefore, it is manifestly intended that this invention be limited only by the following claims and equivalents.

What is claimed is:

1. A device for protecting an electrical device from potentially damaging electrical fields, the device comprising:
   a signal processor configured for detecting and measuring electro-magnetic pulses;
   a signal generator for generating a signal upon detection by the signal processor of electro-magnetic pulses having a predefined level;
   a microprocessor on the electrical device for receiving the signal;
   an input/output bus electrically interconnected to the microprocessor;
   peripherals including memory storage devices interconnected to the microprocessor via the input/output bus, wherein the microprocessor responds to the signal for performing a predetermined operation.

2. The device of claim 1 wherein the electrical device further comprises at least one speaker having a speaker wire such that the signal generator uses the speaker wire as a receiving antenna.

3. The device of claim 1 wherein the electrical device uses a telephone connection as a receiving antenna.

4. The device of claim 1 wherein the electrical device is electrically interconnected to a peripheral device such that the signal generator uses the electrical connection to the peripheral device as a receiving antenna.

5. The device of claim 1 wherein the predetermined operation disconnects the electrical device from a power source.

6. The device of claim 1 further comprises a filter for filtering out noise when detecting and measuring the electro-magnetic pulses.

7. A lightning detection system comprising:
   a modem having a digital signal processor configured to detect and measure electro-magnetic pulses for indicating the presence of a predefined electrical field level; and
   a signal generator for generating a signal responsive to the predefined electrical field level.

8. The lightning detection system of claim 7 wherein the modem is connected to a telephone line which functions as an antenna for reception of the electro-magnetic pulses.

9. The lightning detection system of claim 7 wherein the modem is connected to an electrical device.

10. The lightning detection system of claim 9 wherein the electrical device further comprises a microprocessor for receiving the signal generated by the signal generator.

11. The lightning detection system of claim 10 wherein the microprocessor sends a lightning detected message to a software application responsive to the signal for initiating a preprogrammed function.

12. The lightning detection system of claim 11 wherein the software application automatically powers down the electrical device.

13. The lightning detection system of claim 11 wherein the software application automatically displays a warning message on a display device.

14. The lightning detection system of claim 11 wherein the preprogrammed function disconnects the modem from a power source.

15. The lightning detection system of claim 11 wherein the preprogrammed function disconnects the modem from a telephone connection.

16. The lightning detection system of claim 11 wherein the preprogrammed function switches the electrical device to an uninterruptable power supply.

17. In an electrical device having a modem connected to a telephone line, a method of indicating the presence of a potentially damaging electrical field level, comprising the steps of:
   receiving electro-magnetic pulses in the modem from the telephone line;
   measuring an electric field level of the electro-magnetic pulses;
   generating a signal responsive to a predetermined signal strength of the measured electric field; and
   initiating a preprogrammed function responsive to the signal.

18. The method of claim 17 wherein the step of initiating a preprogrammed function further includes the step of removing power from the electrical device.

19. The method of claim 17 wherein the step of initiating a preprogrammed function further includes the step of displaying a warning message on a display device.

20. A computer system comprising:
   a modem having a digital signal processor configured to detect and measure electro-magnetic pulses for indicating the presence of a potentially damaging electrical field level, wherein the modem generates a signal responsive to a predetermined signal strength level of the electro-magnetic pulses;
   a processor, wherein the processor receives the signal;
   a computer-readable medium; and
   an application program, the application program executed by the processor from the computer-readable medium for initiating a preprogrammed function in response to the signal.

21. The computer system of claim 20 wherein the preprogrammed function automatically powers down the computer.

22. The computer system of claim 20 wherein the executed application program automatically displays a warning message on a display device.

23. The computer system of claim 20 wherein the executed application program automatically switches the computer system to an uninterruptable power supply.

24. The computer system of claim 20 wherein the computer-readable medium comprises a memory.

25. A lightning detection apparatus comprising:
   a sound card having a digital signal processor configured to detect and measure electro-magnetic pulses for indicating the presence of a predefined electrical field level; and
   a signal generator for generating a signal responsive to the predefined electrical field level.

26. The lightning detection system of claim 25 wherein the soundcard is connected to one or more speakers via speaker wire wherein the speaker wire functions as a receive antenna for the electro-magnetic pulses.

27. The lightning detection system of claim 25 wherein the soundcard is coupled to a computer system for receiving the signal and initiating a preprogrammed function.

28. The lightning detection system of claim 27 wherein the preprogrammed function automatically powers down the computer system.

29. A lightning detection apparatus comprising:
means for detecting and measuring electro-magnetic pulses for indicating the presence of a potentially damaging electrical field level wherein the means for detecting and measuring electro-magnetic pulses is part of a modem; and
means for generating a signal responsive to a predetermined signal strength level of the electro-magnetic pulses.

30. The lightning detection system of claim 29 wherein the means for detecting and measuring electro-magnetic pules is performed in a digital signal processor.

31. The lightning detection system of claim 30 wherein the modem is automatically disconnected from a phone jack in response to the signal.

32. A lightning detection apparatus comprising:
means for detecting and measuring electro-magnetic pulses for indicating the presence of a potentially damaging electrical field level wherein the means for detecting and measuring electro-magnetic pulses is part of a sound card; and
means for generating a signal responsive to a predetermined signal strength level of the electro-magnetic pulses.

33. A machine readable medium having machine readable instructions stored thereon for causing a computer to perform the steps comprising:
detecting electro-magnetic pulses on a telephone line;
measuring a signal strength level of the electro-magnetic pulses;
generating a signal responsive to a predetermined signal strength level of the electro-magnetic pulses; and
initiating a preprogrammed function responsive to the signal.

34. The machine readable medium of claim 33 wherein the step of initiating a preprogrammed function further comprises the step of displaying a warning message on a display device.

35. The machine readable medium of claim 33 wherein the step of initiating a preprogrammed function further comprises the step of disconnecting power from the computer.

36. A machine readable medium having machine readable instructions stored thereon for causing a computer to perform the steps comprising:
detecting electro-magnetic pulses on a speaker wire;
measuring a signal strength level of the electro-magnetic pulses;
generating a signal responsive to a predetermined signal strength level of the electro-magnetic pulses; and
initiating a preprogrammed function responsive to the signal.

37. A machine readable medium having machine readable instructions stored thereon for causing a computer to perform the steps comprising:
detecting electro-magnetic pulses on a electrical connection to a peripheral;
measuring a signal strength level of the electro-magnetic pulses;
generating a signal responsive to a predetermined signal strength level of the electro-magnetic pulses; and
initiating a preprogrammed function responsive to the signal.

38. An apparatus having a secondary function of detecting potentially damaging electrical fields, the apparatus comprising:
a signal processor configured for detecting and measuring electro-magnetic pulses indicating the presence of a potentially damaging electrical field, wherein the signal processor detects the electro-magnetic pulses on a wire functioning as an antenna; and
a signal generator for generating a signal upon detection by the signal processor of electro-magnetic pulses having a predefined level.

39. The apparatus of claim 38, wherein the wire functioning as an antenna is a telephone wire.

40. The apparatus of claim 38, wherein the wire functioning as an antenna is a speaker wire.

* * * * *